(12) United States Patent
Kamgaing et al.

(10) Patent No.: US 10,263,346 B2
(45) Date of Patent: Apr. 16, 2019

(54) SINGLE-PACKAGE PHASED ARRAY MODULE WITH INTERLEAVED SUB-ARRAYS

(71) Applicant: INTEL CORPORATION, Santa Clara, CA (US)

(72) Inventors: Telesphor Kamgaing, Chandler, AZ (US); Adel A. Elsherbini, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 328 days.

(21) Appl. No.: 15/197,531

(22) Filed: Jun. 29, 2016

(65) Prior Publication Data
US 2016/0308287 A1    Oct. 20, 2016

Related U.S. Application Data

(63) Continuation of application No. 13/799,645, filed on Mar. 13, 2013, now Pat. No. 9,413,079.

(51) Int. Cl.
*H01Q 21/29* (2006.01)
*H01Q 3/24* (2006.01)
(Continued)

(52) U.S. Cl.
CPC ........... *H01Q 21/293* (2013.01); *H01P 11/00* (2013.01); *H01Q 1/36* (2013.01); *H01Q 1/50* (2013.01);
(Continued)

(58) Field of Classification Search
CPC .......... H01Q 21/293; H01Q 1/36; H01Q 1/50; H01Q 3/24; H01Q 3/26; H01Q 15/08;
(Continued)

(56) References Cited

U.S. PATENT DOCUMENTS 6,703,975 B1    3/2004 Freeman
6,906,665 B1    6/2005 Lam
(Continued)

FOREIGN PATENT DOCUMENTS

CN    102170047 A    8/2011
EP    2330685 A1    6/2011
(Continued)

OTHER PUBLICATIONS

Office Action dated Nov. 17, 2016 for European Application No. 14158385.6, 5 pages.
(Continued)

*Primary Examiner* — Harry K Liu
(74) *Attorney, Agent, or Firm* — Schwabe, Williamson & Wyatt, P.C.

(57) ABSTRACT

Embodiments of the present disclosure are directed to a single-package communications device that includes an antenna module with a plurality of independently selectable arrays of antenna elements. The antenna elements of the different arrays may send and/or receive data signals over different ranges of signal angles. The communications device may further include a switch module to separately activate the individual arrays. In some embodiments, a radio frequency (RF) communications module may be included in the package of the communications device. In some embodiments, the RF communications module may be configured to communicate over a millimeter-wave (mm-wave) network using the plurality of arrays of antenna elements.

21 Claims, 7 Drawing Sheets

(51) Int. Cl.
*H01Q 3/26* (2006.01)
*H01Q 15/08* (2006.01)
*H01Q 21/06* (2006.01)
*H01Q 23/00* (2006.01)
*H01Q 25/00* (2006.01)
*H01P 11/00* (2006.01)
*H01Q 1/50* (2006.01)
*H01Q 1/36* (2006.01)

(52) U.S. Cl.
CPC ............... *H01Q 3/24* (2013.01); *H01Q 3/26* (2013.01); *H01Q 15/08* (2013.01); *H01Q 21/061* (2013.01); *H01Q 21/065* (2013.01); *H01Q 23/00* (2013.01); *H01Q 25/00* (2013.01); *H01L 2224/16225* (2013.01); *Y10T 29/49016* (2015.01); *Y10T 29/49018* (2015.01)

(58) Field of Classification Search
CPC .... H01Q 21/061; H01Q 21/065; H01Q 23/00; H01Q 25/00; H01P 11/00
USPC .......................................................... 342/374
See application file for complete search history.

(56) References Cited

U.S. PATENT DOCUMENTS

| | | | |
|---|---|---|---|
| 2002/0067314 A1 | 6/2002 | Takimoto et al. | |
| 2004/0196189 A1* | 10/2004 | Yeh .................... | H01Q 1/38 343/700 MS |
| 2005/0116854 A1 | 6/2005 | Beez et al. | |
| 2008/0238795 A1* | 10/2008 | Alamouti ............. | H01Q 3/2658 343/768 |
| 2008/0278393 A1 | 11/2008 | Gottwald et al. | |
| 2008/0284655 A1* | 11/2008 | Alamouti ............. | H01Q 1/38 343/700 MS |
| 2009/0009399 A1 | 1/2009 | Gaucher et al. | |
| 2009/0140943 A1 | 6/2009 | Ratni | |
| 2010/0214169 A1 | 8/2010 | Kafle | |
| 2010/0231452 A1* | 9/2010 | Babakhani ............. | G01S 7/032 342/368 |
| 2011/0102263 A1* | 5/2011 | Angeletti ............. | H01Q 3/40 342/373 |
| 2011/0163909 A1 | 7/2011 | Jeong | |
| 2011/0211490 A1 | 9/2011 | Nikula et al. | |
| 2012/0235881 A1* | 9/2012 | Pan .................... | H01Q 1/20 343/893 |
| 2013/0207274 A1 | 8/2013 | Liu et al. | |
| 2014/0091979 A1* | 4/2014 | Fakharzadeh ............ | H01Q 1/38 343/848 |

FOREIGN PATENT DOCUMENTS

| | | |
|---|---|---|
| JP | 02-156706 A | 6/1990 |
| JP | 09-130139 A | 5/1997 |
| JP | 09-246859 A | 9/1997 |
| JP | 2002-111359 A | 4/2002 |
| KR | 2002-0025049 A | 4/2002 |
| KR | 2011-0080469 A | 7/2011 |
| WO | 0231915 A2 | 4/2002 |
| WO | 03073125 A1 | 9/2003 |

OTHER PUBLICATIONS

European Search Report and EP Office Action issued in corresponding European Application No. 14 158 385.6, dated Oct. 20, 2014, 9 pages.
Office Action issued in corresponding Japanese Patent Application Na 2014-048166, dated Dec. 16, 2014, 11 pages.
Notice of Preliminary Rejection issued in corresponding Korean Patent Application No. 2014-0029281, dated Mar. 17, 2015, 9 pages.
Office Action dated Dec. 10, 2015 for Chinese Application No. 201410092124.7, 32 pages.
Office Action dated Mar. 15, 2016 for European Application No. 14158385.6, 5 pages.
Non-Final Office Action dated Nov. 17, 2015 for U.S. Appl. No. 13/799,645, 22 pages.
Notice of Allowance dated Apr. 11, 2016 for U.S. Appl. No. 13/799,645, 9 pages.
Corrected Notice of Allowance dated Apr. 21, 2016 for U.S. Appl. No. 13/799,645, 2 pages.
Corrected Notice of Allowance dated May 24, 2016 for U.S. Appl. No. 13/799,645, 6 pages.
Office Action dated Jul. 31, 2017 for Chinese Application No. 201410092124.7, and translation, 20 pages.
Office Action dated Apr. 4, 2018 for European Application No. 14158385.6, 4 pages.
Office Action dated Jan. 13, 2017 for Chinese Application No. 201410092124.7, and translation, 23 pages.
Office Action dated Dec. 4, 2017 for Chinese Application No. 201410092124.7, and translation, 8 pages.
Office Action dated Aug. 29, 2016 for Chinese Application No. 201410092124.7, 19 pages.

* cited by examiner

SINGLE-PACKAGE PHASED ARRAY MODULE WITH INTERLEAVED SUB-ARRAYS

RELATED APPLICATION

The present application is a continuation of U.S. patent application Ser. No. 13/799,645, filed Mar. 13, 2013, entitled "SINGLE-PACKAGE PHASED ARRAY MODULE WITH INTERLEAVED SUB-ARRAYS," the entire disclosure of which is hereby incorporated by reference in its entirety.

FIELD

Embodiments of the present disclosure generally relate to the field of wireless communications, and more particularly, to phased array modules with interleaved sub-arrays, and associated techniques and configurations.

BACKGROUND

Electronic devices with integrated millimeter-wave (mm-wave) phased array systems enable wireless transmission of data at high data rates (e.g., multiple gigabits per second). These electronic devices communicate using a signal beam that may be scanned in different directions to identify the receiving or transmitting device. Typically, the phased array includes a plurality of antenna elements that transmit signals at a radiation angle. The phases of the signals produced by the antenna elements are controlled to steer the signal beam at a range of angles around the radiation angle. However, such phased arrays can only provide usable signal power over a limited scanning angle range from the radiation angle.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
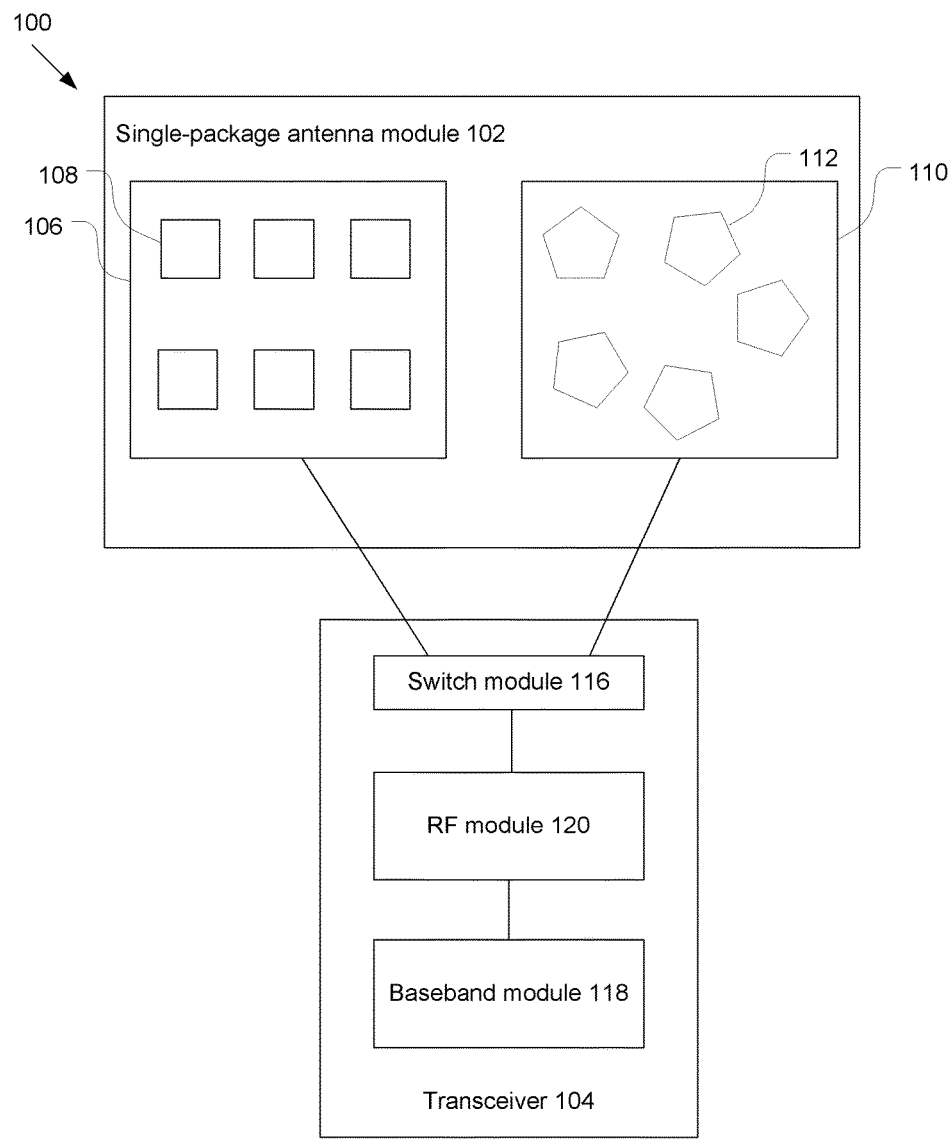
FIG. 1 illustrates a block diagram of a wireless communication device in accordance with some embodiments.

Embodiments of the present disclosure describe single-package phased array modules with interleaved antenna sub-arrays, and associated techniques and configurations. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

FIG. 1 illustrates a wireless communication device 100 in accordance with various embodiments. Wireless communication device 100 may communicate (e.g., transmit and/or receive) signals over a wireless communication network. In some embodiments, the wireless communication network may be a millimeter-wave (mm-wave) network. Wireless communication device 100 may include an antenna module 102 coupled to a transceiver 104. In some embodiments, the antenna module 102 and transceiver 104 may be included in a same package. In these embodiments, the wireless communication device 100 may be referred to as a single-package wireless communication device 100.

In various embodiments, the transceiver 104 may include a switch module 116, a baseband module 118, and a radio frequency (RF) module 120 coupled to one another at least as shown. The baseband module 118 and RF module 120 may be included on the same chip or on separate chips. In some embodiments, both the baseband module 118 and RF module 120 may be included in the same package with the antenna module 102. In other embodiments, the RF module 120 may be included in the same package with the antenna module 102, and the baseband module 118 may be remotely disposed from the antenna module 102.

In various embodiments, the baseband module 118 may provide a baseband data signal to the RF module 120. The RF module 120 may modulate the data signal on to an RF frequency for transmission over the wireless network. In embodiments in which the wireless network is a mm-wave network, the RF frequency may be a mm-wave frequency. For example, the mm-wave frequency may be about 30 to about 300 gigahertz (GHz), such as about 60 GHz in some embodiments. The RF module 120 may pass the modulated data signal to the switch module 116.

In various embodiments, the antenna module 102 may include an antenna substrate (for example, antenna substrate 204 shown in FIGS. 2A-2B) having a surface that is substantially planar. The antenna module 102 may include a plurality of arrays of one or more antenna elements disposed on the surface. For example, as shown in FIG. 1, the antenna module 102 may have a first array 106 that includes one or more antenna elements 108, and a second array 110 that includes one or more antenna elements 112. Accordingly, the antenna module 102 may be referred to as a single-package antenna module.

In various embodiments, the antenna elements 108 may transmit signals within a range of angles around a first angle of maximum radiation (hereinafter "first radiation angle") with respect to the surface, and the antenna elements 112 may transmit signals at a range of angles around a second angle of maximum radiation (hereinafter "second radiation angle") with respect to the surface that is different from the first radiation angle. For example, in some embodiments, the first radiation angle may be about 90 degrees (e.g., perpendicular to the surface of the antenna substrate), while the second radiation angle may be about 0 degrees (e.g., parallel to the surface of the antenna substrate). The radiation of the signal transmitted by a given antenna element may have the greatest intensity at the radiation angle, and the intensity may generally decrease as the angle moves away from the radiation angle of the antenna element. The directionality may be especially pronounced for mm-wave frequencies compared with lower frequencies in the RF spectrum.

In various embodiments, the plurality of antenna elements of an individual array (e.g., antenna elements 108 of first array 106 or antenna elements 112 of second array 110) may combine to form an overall signal beam generated by the array. The array may control the angle of the overall signal beam by separately controlling the phases of the individual antenna elements of the array. For example, the array may send an overall signal beam at a signal angle by controlling the phases of the antenna elements so that the signals produced by the antenna elements constructively interfere with one another at the signal angle and destructively interfere with one another at angles other than the signal angle. Accordingly, the radiation intensity of the overall signal beam may be greatest at the signal angle.

In various embodiments, the switch module 116 may separately activate the first array 106 and/or second array 110 to transmit the data signal over the wireless network. The transceiver 104 may further steer the signal beam produced by the first array 106 and/or second array 110 over a range of angles including the respective first or second radiation angles. For example, in some embodiments, the first array 106 may be activated over a first range of angles of the signal beam, and the second array 110 may be activated over a second range of angles of the signal beam that is different from the first range. Accordingly, the first array 106 and second array 110 may be referred to as being interleaved with one another. In some embodiments, the first and second ranges of angles may overlap. That is, both the first array 106 and second array 110 may be activated over a range of angles in which the first and second ranges overlap.

Figure 2A:
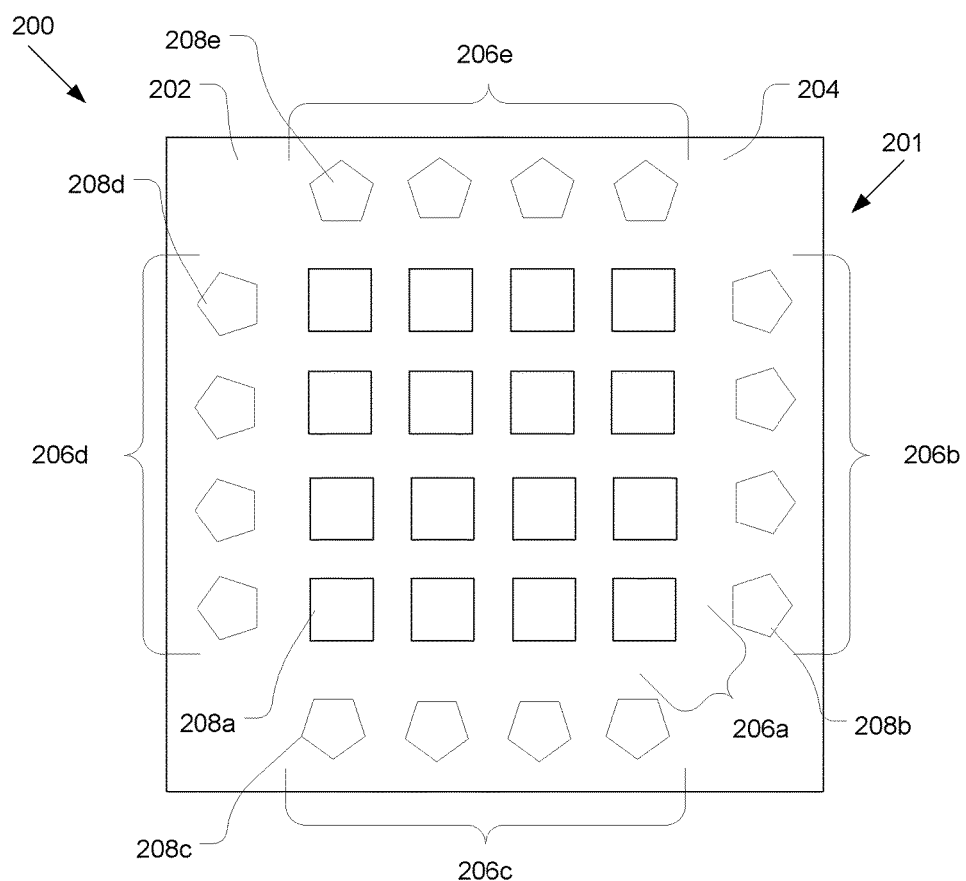
FIG. 2A illustrates a top view of a wireless communication device in accordance with some embodiments.
Figure 2B:
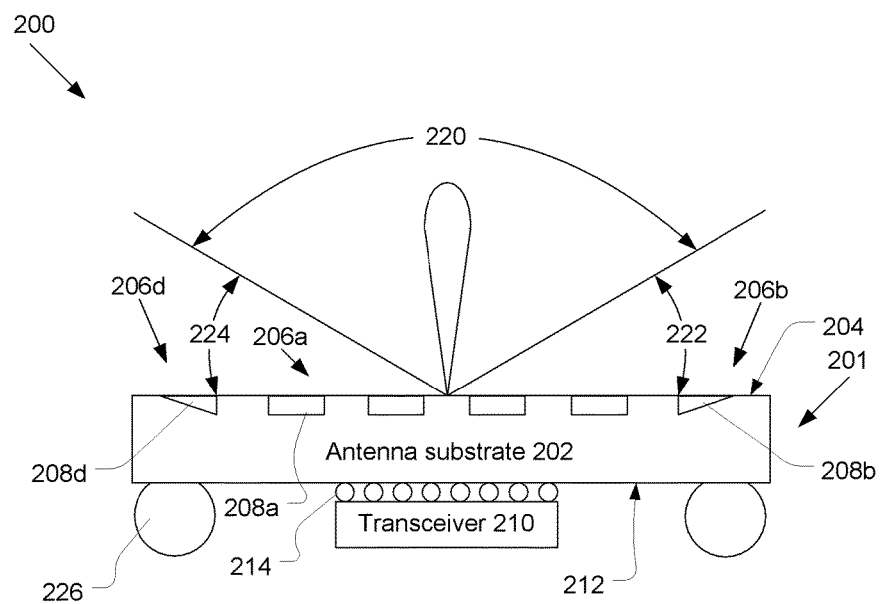
FIG. 2B illustrates a side cross-sectional view of the wireless communication device of FIG. 2A.

FIGS. 2A and 2B show a top view and a side cross-sectional view, respectively, of a single-package communications device 200 in accordance with various embodiments. The communications device 200 may include an antenna module 201 coupled to a transceiver 210. The antenna module 201 may include an antenna substrate 202 having a first surface 204 that is substantially planar. The communications device may further include first array 206*a* of antenna elements 208*a*, second array 206*b* of antenna elements 208*b*, third array 206*c* of antenna elements 208*c*, fourth array 206*d* of antenna elements 208*d*, and fifth array 206*e* of antenna elements 208*e*. The antenna elements 208*a-e* may all be disposed on the first surface 204.

It will be apparent that other embodiments may include any suitable number, configuration, and/or orientation of the antenna modules 206*a-e* or antenna elements 208*a-e* on the first surface 204.

In various embodiments, the antenna elements 208*a* may have a radiation angle of about 90 degrees with respect to the first surface 204 (e.g., perpendicular to the first surface 204). Accordingly, the antenna elements 208*a* may also be referred to as upward radiating antenna elements 208*a*. In contrast, the antenna elements 208*b-e* may have a radiation angle of about 0 degrees with respect to the first surface 204. Accordingly, the antenna elements 208*b-e* may also be referred to as sideward radiating antenna elements 208*b-e*. Additionally, the radiation angles of the antenna elements 208*b-e* of the respective antenna modules 206*b-e* may be oriented differently within the plane of the first surface 204. For example, referring to the top view of FIG. 2A, the antenna elements 208*b* may radiate generally to the right of the antenna substrate 202, the antenna elements 208*c* may radiate generally below the antenna substrate 202, the antenna elements 208*d* may radiate generally to the left of the antenna substrate 202, and the antenna elements 208*e* may radiate generally above the antenna substrate 202.

In some embodiments, as shown in FIG. 2A, the upward radiating antenna elements 208*a* may be disposed on a middle portion of the first surface 204, and the sideward radiating antenna elements 208*b-e* may be disposed on a peripheral portion of the first surface 204 that is closer to the edge of the first surface 204 than the middle portion. This orientation may allow the sideward radiating antenna elements 208*b-e* to transmit and/or receive signals sideways without the signal being interfered with (e.g., blocked or absorbed) by the upward radiating antenna elements 208*a*.

In various embodiments, the antenna elements 208*a-e* may have any suitable structure to provide the respective radiation angles. In some embodiments, the antenna elements may be formed in one or more layers (e.g., including one or more metal layers) disposed on the first surface 204. Accordingly, in some embodiments, the antenna elements may be integrated with the substrate 202 into a multi-layer substrate. In some embodiments, the upward radiating antenna elements 208a may be of a different design from the sideward radiating antenna elements 208b-e. For example, in some embodiments the upward radiating antenna elements 208a may be microstrip antennas. Additionally, or alternatively, in some embodiments, the sideward radiating antenna elements 208b-e may be Vivaldi radiators or bent patches.

As shown in FIG. 2B, the transceiver 210 may be coupled to a second surface 212 of the antenna substrate 202, opposite the first surface 204. The transceiver 210 may be electrically coupled to the arrays 206a-e, e.g., via solder balls 214 and/or direct metal-to-metal bonding. In some embodiments, the transceiver 210 may be included in a die. The transceiver 210 may include a switch module (e.g., switch module 116) and/or an RF module (e.g., RF module 118). For mm-wave networks, it may be important for the RF module to be close to the antenna elements 208a-e. In some embodiments, the transceiver 210 may further include a baseband module (e.g., baseband module 118). In other embodiments, the RF module of transceiver 210 may be coupled to a baseband module that is remotely disposed from the communications device 200.

In various embodiments, the transceiver 210 may steer the signal beam over a range of angles with respect to the first surface 204, and may separately activate the arrays 206a-e over different ranges of angles (e.g., using the switch module). For example, FIG. 2B shows example ranges of angles for one cross-sectional plane. As shown in FIG. 2B, the array 206a may be activated over a first range 220 of angles of the signal beam, the array 206b may be activated over a second range 222 of angles of the signal beam, and the array 206d may be activated over a third range 224 of angles of the signal beam. For example, the second range 222 may be from about 0 degrees to 30 degrees, the first range 220 may be from about 30 degrees to about 150 degrees, and the third range 224 may be from about 150 degrees to about 180 degrees. In other embodiments, different ranges may be used and/or the ranges may overlap.

In some embodiments, the communications device 200 may further include second level interconnects (SLIs) 226 coupled to the antenna substrate 202. The SLIs 226 may facilitate the coupling of the communications device 200 to other components of a wireless communications system.

Figure 3:
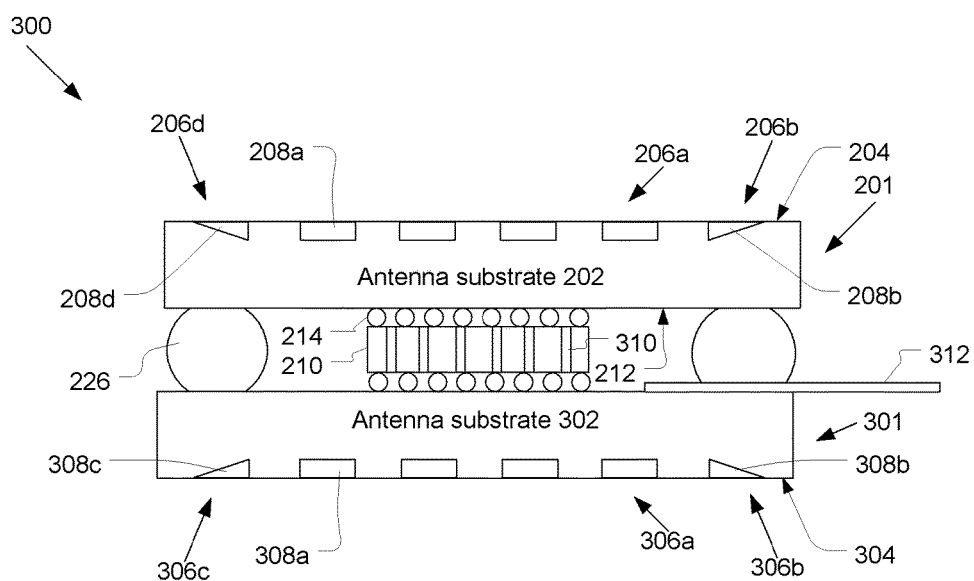
FIG. 3 illustrates a side cross-sectional view of another wireless communication device in accordance with some embodiments.

FIG. 3 illustrates a communications device 300 that is similar to the communications device 200 but includes a second antenna module 301 coupled on the other side of the transceiver 210 from the antenna module 201. The second antenna module 301 may include similar structure to the antenna module 201. For example, the antenna module 301 may include an antenna substrate 302 with a first surface 304. The first surface 304 may be oriented opposite the first surface 204 of the antenna module 201. The antenna module 301 may further include a plurality of arrays of antenna elements, e.g., arrays 306a-c that include respective antenna elements 308a-c, disposed on the surface 304. The antenna elements 308a-c of different antenna modules may have different radiation angles from one another. Although FIG. 3 shows only a cross-sectional view of the second antenna module 301, in some embodiments, the antenna module 301 may have a similar arrangement of arrays and/or antenna elements as that of antenna module 201 shown in FIG. 2A. The transceiver 210 may independently activate the respective arrays 306a-c and 206a-e. Accordingly, the communications device 300 may be capable of steering a signal beam substantially 360 degrees relative to the surface 204 (or 304).

In some embodiments, the transceiver 210 may include through silicon vias (TSVs) 310. TSVs 310 may facilitate communications between the transceiver 210 and the antenna modules 201 and 301 disposed on opposite sides of the transceiver 210. Alternatively, or additionally, the transceiver 210 may include a plurality of die to route signals to the respective antenna modules 201 or 301.

In some embodiments, the communications device 300 may include a ribbon cable 312 to facilitate communications between the communications device 300 and other components of a wireless communication system. For example, the ribbon cable 312 may be used to route low frequency (e.g., baseband) signals to/from the communications device 300.

As discussed above, in some embodiments, the antenna elements of the different arrays may have different designs (e.g., different structures) and/or may be oriented differently on the surface of the antenna substrate. Alternatively, or additionally, a dielectric layer may be disposed on top of the arrays to form lenses over the respective antenna elements to provide the respective radiation angles of the antenna elements.

Figure 4:
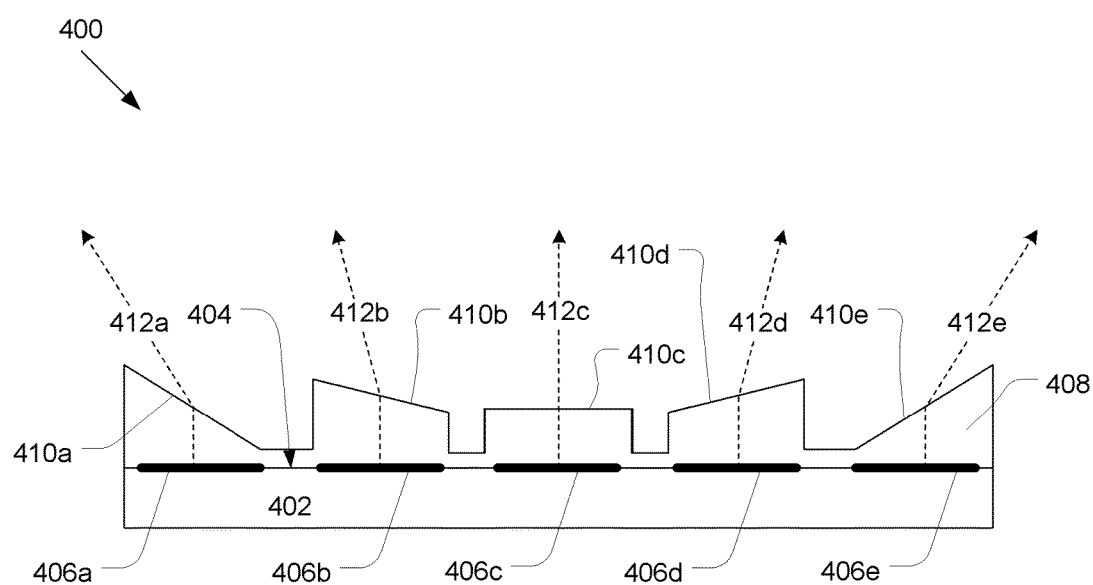
FIG. 4 illustrates a cross-sectional view of an antenna module having a dielectric layer over respective antenna elements in accordance with some embodiments.

For example, FIG. 4 illustrates a simplified cross-sectional view of an antenna module 400 in accordance with some embodiments. The antenna module 400 may include an antenna substrate 402 having a planar surface 404. The antenna module 400 may further include a plurality of antenna elements 406a-e. The antenna elements 406a-e may be included in one or more arrays as discussed herein. In some embodiments, the antenna elements 406a-e may be of the same design and/or may be oriented the same with respect to the surface 404.

The antenna module 400 may further include a dielectric layer 408 disposed on top of the antenna elements 406a-e. The dielectric layer 408 may form lenses 410a-e over the respective antenna elements 406a-e. The lenses 410a-e may direct the signal produced by the respective antenna element 406a-e to provide respective radiation angles of the antenna elements 406a-e (as shown by signal lines 412a-e). For example, the lenses 410a-e may have angled surfaces with respect to the surface 404 to direct the signal.

In some embodiments, as shown in FIG. 4, a central antenna element 406c may have a radiation angle that is substantially perpendicular to the surface 404, and the other radiation angles of the other antenna elements may be angled progressively more from the perpendicular as the antenna elements become further away from the central antenna element 406c (e.g., toward the edges of the surface 404). For example, the outer antenna elements 406a and 406e may have radiation angles that are angled more from the perpendicular from the radiation angles of intermediate antenna elements 406b and 406d. This arrangement may facilitate transmission and/or reception of signal beams by the antenna elements 406a-e over a wide range of signal angles.

In various embodiments, the dielectric layer 408 may be any suitable material capable of directing RF (e.g., mm-wave) signals, such as organic substrates (e.g. liquid crystal polymer, teflon), silicon dioxide and/or a ceramic-based material.

Figure 5:
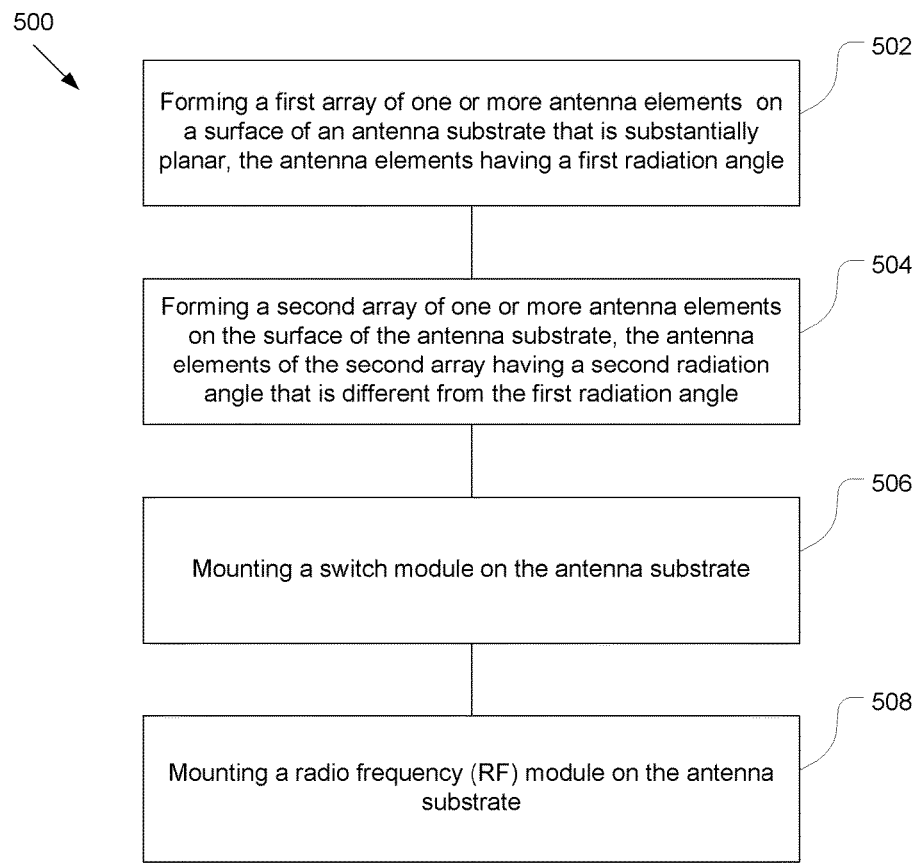
FIG. 5 illustrates a flow chart of a method of manufacturing a wireless communication device in accordance with some embodiments.

FIG. 5 illustrates a flow diagram for a method 500 of fabricating a phased array module in accordance with some embodiments. The method 500 may comport with embodiments described in connection with FIGS. 1-4.

At 502, the method 500 may include forming a first array of one or more antenna elements (e.g., array 206a of antenna elements 208b) on a surface of an antenna substrate that is substantially planar (e.g., the surface 204 of antenna substrate 202). In some embodiments, the first array of one or more antenna elements may be formed by one or more layers integrated with the antenna substrate. In other embodiments, the antenna elements of the first array may be mounted on the surface of the antenna substrate. In some embodiments, the antenna substrate may be formed with die pads on an opposite side of the antenna substrate from the antenna elements.

In various embodiments, the first array may be used to communicate over a wireless network, such as a mm-wave network. The one or more antenna elements of the first array may have a first radiation angle of radiation relative to the surface.

At 504, the method 500 may further include forming a second array of one or more antenna elements (e.g., array 206b of antenna elements 208b) on the surface. The one or more antenna elements of the second array may have a second radiation angle of radiation relative to the surface. In some embodiments, the second array of one or more antenna elements may be formed by one or more layers integrated with the antenna substrate. The second array may be formed contemporaneously with the first array in some embodiments. In other embodiments, the antenna elements of the second array may be mounted on the surface of the antenna substrate.

The antenna elements of the second array may be the same design or a different design from the antenna elements of the first array. In some embodiments (not shown in FIG. 5), the method 500 may include forming a dielectric layer (e.g., dielectric layer 408) on top of the first and second arrays. The dielectric layer may include lenses (e.g., lenses 410a-e) over respective antenna elements of the first and second arrays to provide the respective first and second radiation angles.

In some embodiments, the method 500 may further include, at 506, mounting a switch module (e.g., switch module 116) on the antenna substrate. The switch module may be electrically coupled to the first and second arrays and configured to separately activate the first and second arrays to facilitate communication over the wireless network.

In some embodiments, the method 500 may further include, at 508, mounting an RF module (e.g., RF module 120) to the antenna substrate. The RF module may modulate a data signal on to a radio frequency, such as a mm-wave frequency, for transmission over the wireless network. In some embodiments, the RF module may be mounted on an opposite side of the antenna substrate from the surface on with the first and second arrays are mounted. In some embodiments, the RF module may be included in a same die with the switch module.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 6:
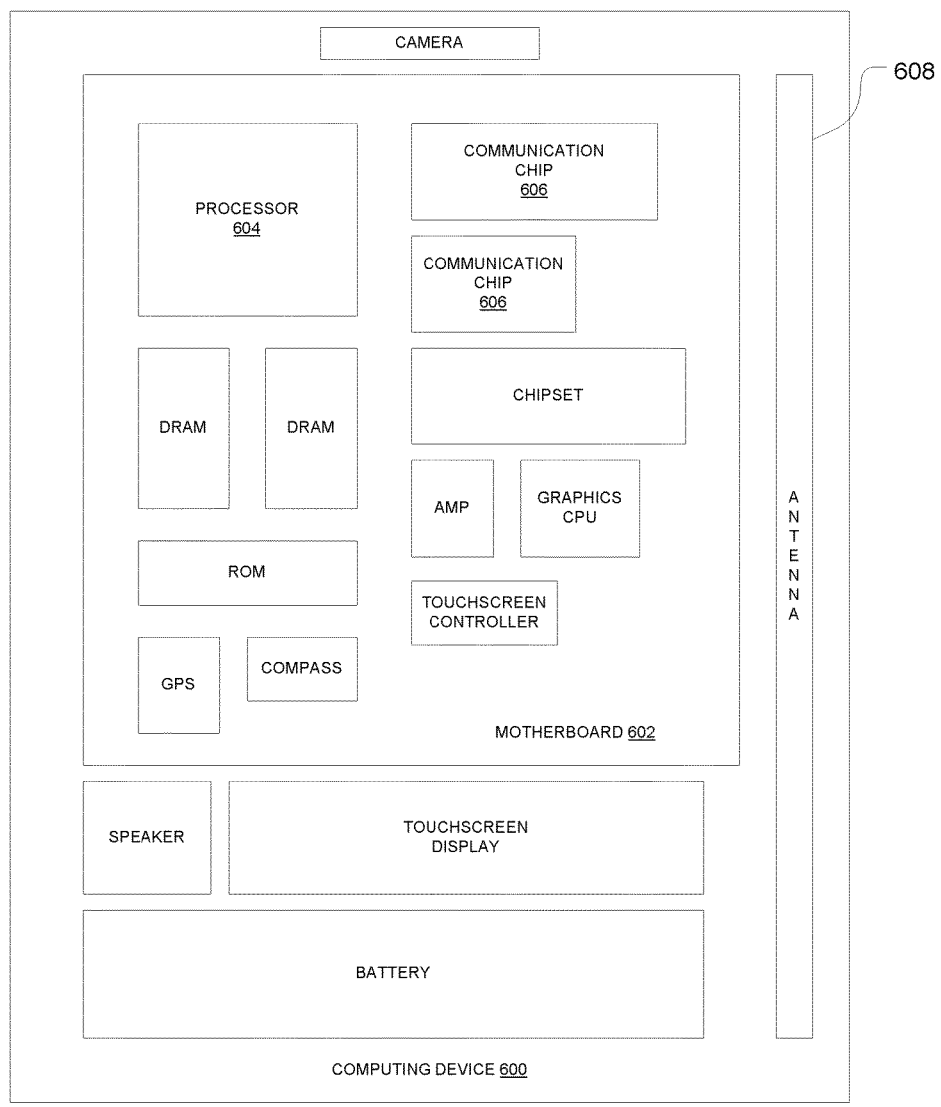
FIG. 6 schematically illustrates a computing device in accordance with some embodiments.

FIG. 6 schematically illustrates a computing device 600 in accordance with some embodiments. The computing device 600 may house a board such as motherboard 602. The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604.

According to various embodiments, at least one of the communication chips 606 may include the transceiver described herein (e.g., transceiver 104 or 210). The communication chip 606 may further be coupled to an antenna 608. In various embodiments, the antenna 508 may include the antenna module described herein (e.g., antenna module 102, 201, 301, or 400). In some embodiments, the communication chip 606 and antenna 608 may form a single-package wireless communication device as described herein (e.g., communication device 100, 200, or 300)

Depending on its applications, computing device 600 may include other components that may or may not be physically and electrically coupled to the motherboard 602. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Institute for Electrical and Electronic Engineers (IEEE) standards including Wi-Fi (IEEE 802.11 family), WiGig, IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. In some embodiments, the communication chip 606 may communicate over a mm-wave network. The communication chip 606 may operate in accordance with other wireless protocols in other embodiments.

The computing device 600 may include a plurality of communication chips 606. For instance, a first communication chip 606 may be dedicated to shorter range wireless communications such as mm-wave, Wi-Fi, and/or Bluetooth and a second communication chip 606 may be dedicated to longer range wireless communications such as GPS, EDGE, GPRS, CDMA, WiMAX, LTE, Ev-DO, and/or others.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

EXAMPLES

In various embodiments, an apparatus for communicating over a wireless network is provided that includes an antenna substrate having a surface that is substantially planar; a first array of one or more antenna elements disposed on the surface and configured to communicate wirelessly over a wireless network, wherein the first array is configured to steer a signal beam over a first range of angles relative to the surface, and a second array of one or more antenna elements disposed on the surface and configured to communicate wirelessly over the wireless network, wherein the second array is configured to steer the signal beam over a second range of angles relative to the surface that is different from the first range of angles.

In some embodiments, the apparatus may further include a switch module coupled to the first and second arrays and configured to separately activate the first and second arrays over the respective first and second ranges of angles. In some embodiments, the wireless network may be a millimeter-wave (mm-wave) network. In some embodiments, the apparatus may further include a radio frequency (RF) module coupled to the antenna substrate and configured to modulate a data signal on to a mm-wave frequency for transmission over the mm-wave network.

In some embodiments, the one or more antenna elements of the first array have a first angle of maximum radiation relative to the surface, and the one or more antenna elements of the second array have a second angle of maximum radiation relative to the surface that is different from the first angle of maximum radiation. In some embodiments, the apparatus may further include a dielectric layer disposed on top of the first and second arrays, the dielectric layer forming lenses over respective antenna elements of the first and second arrays to provide the respective first angle of maximum radiation or second angle of maximum radiation.

In some embodiments, the first array of one or more antenna elements is disposed on a middle portion of the surface and the first angle of maximum radiation angle is about 90 degrees relative to the surface, and the second array of one or more antenna elements is disposed on a peripheral portion of the surface and the second angle of maximum radiation is less than 90 degrees relative to the surface.

In some embodiments, the one or more antenna elements of the first and second arrays are formed in one or more metal layers on the antenna substrate. In some embodiments, the one or more antenna elements of the first array are of a different design than the one or more antenna elements of the second array. For example, in some embodiments the one or more antenna elements of the first array are microstrip antennas, and wherein the one or more antenna elements of the second array are Vivaldi radiators or bent patches.

In some embodiments, the apparatus may further include a third array of one or more antenna elements disposed on the surface, wherein the third array is configured to steer the signal beam over a third range of angles that is different from the first and second ranges of angles.

In various embodiments, a method of fabricating a wireless communication device is provided that may include forming a first array of one or more antenna elements on a surface of an antenna substrate that is substantially planar, wherein the first array is configured to communicate wirelessly over a wireless network, and wherein the first array is configured to steer a signal beam over a first range of angles relative to the surface; and forming a second array of one or more antenna elements on the surface, wherein the second array is configured to communicate wirelessly over the wireless network, and wherein the second array is configured to steer the signal beam over a second range of angles relative to the surface that is different from the first range of angles.

In some embodiments, the method may further include coupling a switch module to the antenna substrate, the switch module configured to separately activate the first and second arrays of antenna elements over the respective first and second ranges of angles. In some embodiments of the method, the wireless network is a mm-wave network. In some embodiments of the method, the surface of the substrate is a first surface, and the method further includes mounting a radio frequency (RF) module to a second surface of the antenna substrate opposite the first surface, the RF module configured to modulate a data signal on to a mm-wave frequency for transmission over the mm-wave network.

In some embodiments of the method, the one or more antenna elements of the first array have a first angle of maximum radiation relative to the surface, and the one or more antenna elements of the second array have a second angle of maximum radiation relative to the surface that is different from the first angle of maximum radiation. In some embodiments, the method may further include forming a dielectric layer on top of the first and second arrays, the dielectric layer including lenses over respective antenna elements of the first and second arrays to provide the respective first angle of maximum radiation or second angle of maximum radiation.

In some embodiments of the method, the forming the one or more antenna elements of the first array or second array includes forming one or more metal layers on the surface of the substrate.

Various embodiments may provide a system for communicating over a wireless network that includes an antenna substrate having a surface that is substantially planar; a first array of one or more antenna elements disposed on the surface, wherein the first array is configured to steer a signal beam over a first range of angles relative to the surface; a second array of one or more antenna elements disposed on the surface, wherein the second array is configured to steer the signal beam over a second range of angles relative to the surface that is different from the first range of angles; a radio frequency (RF) module coupled to the antenna substrate and configured to modulate a data signal for transmission over a millimeter-wave (mm-wave) network; and a switch module coupled to the antenna substrate and configured to separately activate the first and second arrays of antenna elements to transmit the data signal over the mm-wave network.

In some embodiments of the system, the one or more antenna elements of the first array have a first angle of maximum radiation relative to the surface, and the one or more antenna elements of the second array have a second angle of maximum radiation relative to the surface that is different from the first angle of maximum radiation. In some embodiments, the system further includes a dielectric layer disposed on top of the first and second arrays, the dielectric layer forming lenses over respective antenna elements of the first and second arrays to provide the respective first angle of maximum radiation or second angle of maximum radiation.

In some embodiments, the system may further include a baseband module mounted on the antenna substrate and configured to provide the data signal to the RF module. In some embodiments, the RF module is configured to receive the data signal from a baseband module that is remotely disposed from the antenna substrate. In some embodiments, the antenna substrate, first and second arrays, RF module, and switch module are included in a same package.

In some embodiments of the system, the antenna substrate is a first antenna substrate, the surface of the antenna substrate is a first surface, the RF module is coupled to a second surface of the antenna substrate opposite the first surface, and the system further includes: a second antenna substrate coupled to the RF module opposite the first antenna substrate, the second antenna substrate having a first surface that is oriented opposite the first surface of the first antenna substrate; a third array of one or more antenna elements disposed on the first surface of the second substrate and configured to steer the signal beam over a third range of angles relative to the first surface of the second substrate; and a fourth array of one or more antenna elements disposed on the first surface of the second substrate and configured to steer the signal beam over a fourth range of angles relative to the first surface of the second substrate that is different from the third range of angles; wherein the first, second, third, and fourth arrays are configured to be independently activated.

Various embodiments may include any suitable combination of the above-described embodiments. Furthermore, some embodiments may include one or more non-transitory computer-readable media having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
   an antenna substrate having a surface that is substantially planar;
   a first array of one or more antenna elements disposed on the surface and configured to communicate wirelessly over a wireless network, wherein the first array is configured to steer a signal beam over a first range of angles relative to the surface and the one or more antenna elements of the first array are microstrip antennas; and
   a second array of one or more antenna elements disposed on the surface and configured to communicate wirelessly over the wireless network, wherein the second array is configured to steer the signal beam over a second range of angles relative to the surface that is different from the first range of angles and the one or more antenna elements of the second array are Vivaldi radiators or bent patches,
   wherein the one or more antenna elements of the first array have a first angle of maximum radiation relative to the surface, wherein the one or more antenna elements of the second array have a second angle of maximum radiation relative to the surface that is different from the first angle of maximum radiation, and wherein the first array of one or more antenna elements is disposed on a middle portion of the surface and the second array of one or more antenna elements is disposed on a peripheral portion of the surface.

2. The apparatus of claim 1, further comprising a switch module coupled to the first and second arrays and configured to separately activate the first and second arrays over the respective first and second ranges of angles.

3. The apparatus of claim 1, wherein the wireless network is a millimeter-wave (mm-wave) network.

4. The apparatus of claim 3, further comprising:
   a radio frequency (RF) module coupled to the antenna substrate and configured to modulate a data signal on to a mm-wave frequency for transmission over the mm-wave network.

5. The apparatus of claim 1, wherein the apparatus further comprises a dielectric layer disposed on top of the first and second arrays, the dielectric layer forming lenses over respective antenna elements of the first and second arrays to provide the respective first angle of maximum radiation or second angle of maximum radiation.

6. The apparatus of claim 1, wherein the one or more antenna elements of the first and second arrays are formed in one or more metal layers on the antenna substrate.

7. The apparatus of claim 1, wherein the one or more antenna elements of the second array are Vivaldi radiators.

8. The apparatus of claim 1, wherein the one or more antenna elements of the second array are bent patches.

9. The apparatus of claim 1, further comprising a third array of one or more antenna elements disposed on the surface, wherein the third array is configured to steer the signal beam over a third range of angles that is different from the first and second ranges of angles.

10. A method comprising:
    forming a first array of one or more antenna elements on a middle portion of a surface of an antenna substrate that is substantially planar, wherein the one or more antenna elements of the first array are microstrip antennas and the first array is configured to communicate wirelessly over a wireless network, and wherein the first array is configured to steer a signal beam over a first range of angles relative to the surface; and forming a second array of one or more antenna elements on a peripheral portion of the surface, wherein the one or more antenna elements of the second array are Vivaldi radiators or bent patches and the second array is configured to communicate wirelessly over the wireless network, and wherein the second array is configured to steer the signal beam over a second range of angles relative to the surface that is different from the first range of angles, wherein the one or more antenna elements of the first array have a first angle of maximum radiation relative to the surface, wherein the one or more antenna elements of the second array have a second angle of maximum radiation relative to the surface that is different from the first angle of maximum radiation.

11. The method of claim 10, further comprising:
coupling a switch module to the antenna substrate, the switch module configured to separately activate the first and second arrays of antenna elements over the respective first and second ranges of angles.

12. The method of claim 10, wherein the wireless network is a millimeter-wave (mm-wave) network.

13. The method of claim 12, wherein the surface is a first surface and the method further comprises:
mounting a radio frequency (RF) module to a second surface of the antenna substrate opposite the first surface, the RF module configured to modulate a data signal on to a mm-wave frequency for transmission over the mm-wave network.

14. The method of claim 10, further comprising forming a dielectric layer on top of the first and second arrays, the dielectric layer including lenses over respective antenna elements of the first and second arrays to provide the respective first angle of maximum radiation or second angle of maximum radiation.

15. The method of claim 10, wherein the forming the one or more antenna elements of the first array or second array includes forming one or more metal layers on the surface of the substrate.

16. A system comprising:
an antenna substrate having a surface that is substantially planar;
a first array of one or more antenna elements disposed on the surface, wherein the one or more antenna elements of the first array are microstrip antennas and the first array is configured to steer a signal beam over a first range of angles relative to the surface;
a second array of one or more antenna elements disposed on the surface, wherein the one or more antenna elements of the second array are Vivaldi radiators or bent patches and the second array is configured to steer the signal beam over a second range of angles relative to the surface that is different from the first range of angles;
a radio frequency (RF) module coupled to the antenna substrate and configured to modulate a data signal for transmission over a millimeter-wave (mm-wave) network;
a switch module coupled to the antenna substrate and configured to separately activate the first and second arrays of antenna elements to transmit the data signal over the mm-wave network; and
a baseband module mounted on the antenna substrate and configured to provide the data signal to the RF module.

17. The system of claim 16, wherein the one or more antenna elements of the first array have a first angle of maximum radiation relative to the surface, and wherein the one or more antenna elements of the second array have a second angle of maximum radiation relative to the surface that is different from the first angle of maximum radiation.

18. The system of claim 17, further comprising a dielectric layer disposed on top of the first and second arrays, the dielectric layer forming lenses over respective antenna elements of the first and second arrays to provide the respective first angle of maximum radiation or second angle of maximum radiation.

19. The system of claim 16, wherein the RF module is configured to receive the data signal from a baseband module that is remotely disposed from the antenna substrate.

20. The system of claim 16, wherein the antenna substrate, first and second arrays, RF module, and switch module are included in a same package.

21. The system of claim 16, wherein the antenna substrate is a first antenna substrate, wherein the surface of the antenna substrate is a first surface, wherein the RF module is coupled to a second surface of the antenna substrate opposite the first surface, and wherein the system further comprises:
a second antenna substrate coupled to the RF module opposite the first antenna substrate, the second antenna substrate having a first surface that is oriented opposite the first surface of the first antenna substrate;
a third array of one or more antenna elements disposed on the first surface of the second substrate and configured to steer the signal beam over a third range of angles relative to the first surface of the second substrate; and
a fourth array of one or more antenna elements disposed on the first surface of the second substrate and configured to steer the signal beam over a fourth range of angles relative to the first surface of the second substrate that is different from the third range of angles;
wherein the first, second, third, and fourth arrays are configured to be independently activated.

* * * * *